(12) United States Patent
Chen et al.

(10) Patent No.: US 9,214,487 B2
(45) Date of Patent: Dec. 15, 2015

(54) IMAGE SENSOR HAVING LIGHT DISTRIBUTING ELEMENT

(71) Applicant: Novatek Microelectronics Corp., Hsinchu (TW)

(72) Inventors: I-Hsiu Chen, Taipei (TW); Shu-Fang Wang, Hsinchu (TW); Po-Jen Hsiao, New Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 143 days.

(21) Appl. No.: 14/095,984

(22) Filed: Dec. 3, 2013

(65) Prior Publication Data

US 2014/0332664 A1    Nov. 13, 2014

Related U.S. Application Data

(60) Provisional application No. 61/822,872, filed on May 13, 2013.

(30) Foreign Application Priority Data

Jul. 2, 2013    (TW) .............................. 102123704 A

(51) Int. Cl.
*H01L 27/00* (2006.01)
*H01L 27/146* (2006.01)

(52) U.S. Cl.
CPC ...... *H01L 27/1464* (2013.01); *H01L 27/14627* (2013.01)

(58) Field of Classification Search
CPC .............. H01L 27/148; H01L 27/1464; H01L 31/0232
See application file for complete search history.

(56) References Cited

U.S. PATENT DOCUMENTS

| 8,791,403 B2 * | 7/2014 | Wang et al. .................... 250/216 |
| 2011/0108938 A1 * | 5/2011 | Nozaki et al. ................. 257/432 |
| 2011/0226934 A1 | 9/2011 | Tian et al. |

FOREIGN PATENT DOCUMENTS

| JP | 2013504036 | 2/2013 |
| TW | 201130124 | 9/2011 |

OTHER PUBLICATIONS

"Office Action of Taiwan Counterpart Application", issued on Oct. 14, 2014, p. 1-p. 6.

\* cited by examiner

*Primary Examiner* — Tony Ko
(74) *Attorney, Agent, or Firm* — Jianq Chyun IP Office

(57) ABSTRACT

An image sensor including a plurality of sensing pixels, a plurality of micro-lenses disposed on the sensing pixels and a plurality of first light distributing elements disposed between the sensing pixels and the micro-lenses is provided. Each of the first light distributing elements includes a first refractive index pattern and a second refractive index pattern surrounding the first refractive index pattern. The refractive index of the first refractive index pattern is larger than the refractive index of the second refractive index pattern.

19 Claims, 15 Drawing Sheets

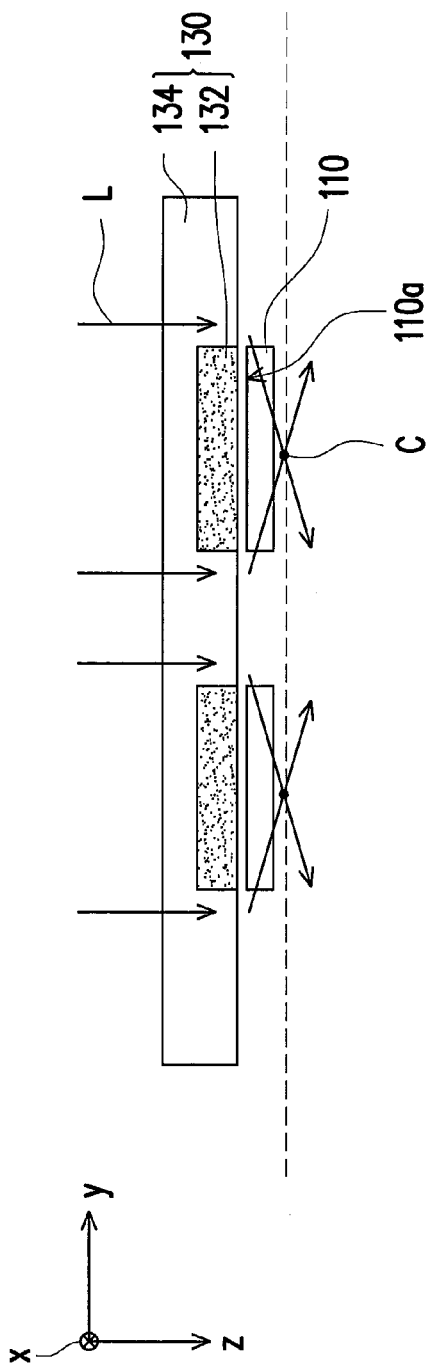
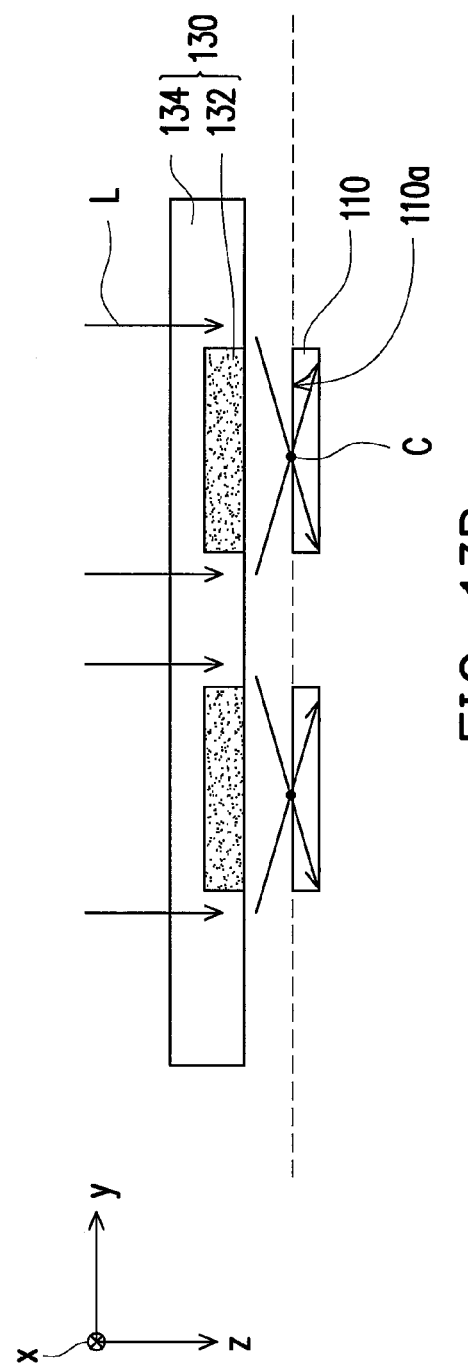
FIG. 13A
FIG. 13B

IMAGE SENSOR HAVING LIGHT DISTRIBUTING ELEMENT

CROSS-REFERENCE TO RELATED APPLICATION

This application claims the priority benefits of U.S. provisional application Ser. No. 61/822,872, filed on May 13, 2013 and Taiwan application serial no. 102123704, filed on Jul. 2, 2013. The entirety of each of the above-mentioned patent applications is hereby incorporated by reference herein and made a part of this specification.

BACKGROUND OF THE INVENTION

1. Field of the Invention

The invention relates to an optoelectronic device, and more particularly, to an image sensor.

2. Description of Related Art

With developments and improvements in electronic products such as a digital camera, demands for image sensors consumer market are rapidly increased. Generally, an image sensor can be divided into major types including a front side illuminated image sensor and a backside illuminated image sensor.

In the front side illuminated image sensor, sensing pixels are formed on the front side of a substrate, and a metal circuit layer is disposed above the sensing pixels. An incident light needs to pass through the metal circuit layer in order to reach the sensing pixels. Due to blocking of the metal circuit layer, the light sensitivity of front side illuminated image sensor is low. In comparison with the front side illuminated image sensor, the incident light is irradiated from a back side of a substrate into the backside illuminated image sensor to reach the sensing pixels without passing through a metal circuit layer. Therefore, the backside illuminated image sensor has relatively higher light sensitivity.

However, in both the front side illuminated image sensor and the backside illuminated image sensor, when the number of sensing pixels is increased and the size of each sensing pixel is reduced, the incident light cannot be easily converged to the corresponding sensing pixel, such that the performance of the image sensor cannot be improved.

SUMMARY OF THE INVENTION

The invention is directed to an image sensor with high performance.

The invention provides an image sensor including a plurality of sensing pixels, a plurality of micro-lenses disposed on the sensing pixels and a plurality of first light distributing elements disposed between the sensing pixels and the micro-lenses. Each of the first light distributing elements includes a first refractive index pattern and a second refractive index pattern surrounding the first refractive index pattern. The refractive index of the first refractive index pattern is larger than the refractive index of the second refractive index pattern.

In an embodiment of the invention, the first refractive index pattern and at least a part of the second refractive index pattern are substantially located on the same plane.

In an embodiment of the invention, each of the first refractive index patterns has a first surface facing the micro-lenses, and the second refractive index pattern covers the first surface of each of the first refractive index patterns.

In an embodiment of the invention, the anti-reflective structure is composed of each of the first refractive index patterns and another film layer on the sensing pixels.

In an embodiment of the invention, the another film layer is the second refractive index pattern.

In an embodiment of the invention, the first refractive index pattern and the second refractive index pattern of each of the first light distributing elements are transparent.

In an embodiment of the invention, each of the first refractive index patterns is located on a reference plane, and a light spot is formed on the reference plane after the incident light passes through the micro-lens corresponding to the first refractive index pattern, and the light spot entirely covers the first refractive index pattern.

In an embodiment of the invention, the first refractive index pattern has the first surface facing the micro-lenses, a second surface facing the sensing pixels and a sidewall connecting the first surface and the second surface. When an incident light from each of the micro-lenses is passing through the sidewall of the first refractive index pattern, the incident light deflects towards a central axis of the first refractive index pattern. A central axis of the first refractive index pattern penetrates the first surface and the second surface of the first refractive index pattern.

In an embodiment of the invention, the incident light converges at a converging point after passing through the sidewall of the first refractive index pattern. A light receiving surface of the sensing pixel corresponding to the first refractive index pattern is located between the first refractive index pattern and the converging point, or located on the converging point.

In an embodiment of the invention, the first surface of the first refractive index pattern is a smooth surface closest to the micro-lenses in the first refractive index pattern. The sidewall of the first refractive index pattern contacts with the first surface and the second surface. The sidewall of the first refractive index pattern is a smooth surface.

In an embodiment of the invention, a cross section is cut by cutting the first refractive index pattern with a reference plane perpendicular to the light receiving surface of the sensing pixels. The cross section is a rectangular shape, a trapezoid shape or an arciform shape.

In an embodiment of the invention, the first surface of the first refractive index pattern is a plane parallel to the light receiving surface of the sensing pixels. The sidewall of the first refractive index pattern is a plane perpendicular to the light receiving surface of the sensing pixels In an embodiment of the invention, the image sensor further includes a plurality of light distributing elements. The second light distributing elements are disposed between the micro-lenses and the first light distributing elements. Each of the second light distributing elements includes a third refractive index pattern and a fourth refractive index pattern surrounding the third refractive index pattern. A refractive index of the third refractive index pattern is larger than a refractive index of the fourth refractive index pattern.

In an embodiment of the invention, the first light distributing element contacts with the second light distributing element.

In an embodiment of the invention, the image sensor includes a spacer. The spacer is located between the first light distributing element and the second light distributing element.

In an embodiment of the invention, the image sensor further includes a circuit layer electrically connected to the sensing pixels. The sensing pixels are disposed between the first light distributing elements and the circuit layer.

In an embodiment of the invention, the image sensor further includes a circuit layer electrically connected to the sensing pixels. The first light distributing elements are disposed between the circuit layer and the sensing pixels.

In an embodiment of the invention, each of the first refractive index patterns and the corresponding sensing pixel are substantially aligned in a direction perpendicular to the light receiving surface of the sensing pixels.

In an embodiment of the invention, the first refractive index patterns of the first light distributing elements are arranged in array and separated from each other. The second refractive index patterns of the second light distributing elements contact with each other so as to form a pattern. The pattern fills gaps between the first refractive index patterns.

In an embodiment of the invention, the first refractive index patterns of the first light distributing elements belong to the same layer, and the second refractive index patterns of the second light distributing elements belong to the same film layer.

In summary, the image sensor according to an embodiment of the invention can converge the incident light effectively to the sensing pixel through the light distributing elements, so as to improve the performance of the image sensor.

To make the above features and advantages of the disclosure more comprehensible, several embodiments accompanied with drawings are described in detail as follows.

BRIEF DESCRIPTION OF THE DRAWINGS

FIG. 13A to FIG. 13B respectively show a suitable relative position between the first light distributing element and the sensing pixels.

DESCRIPTION OF THE EMBODIMENTS

Figure 1:
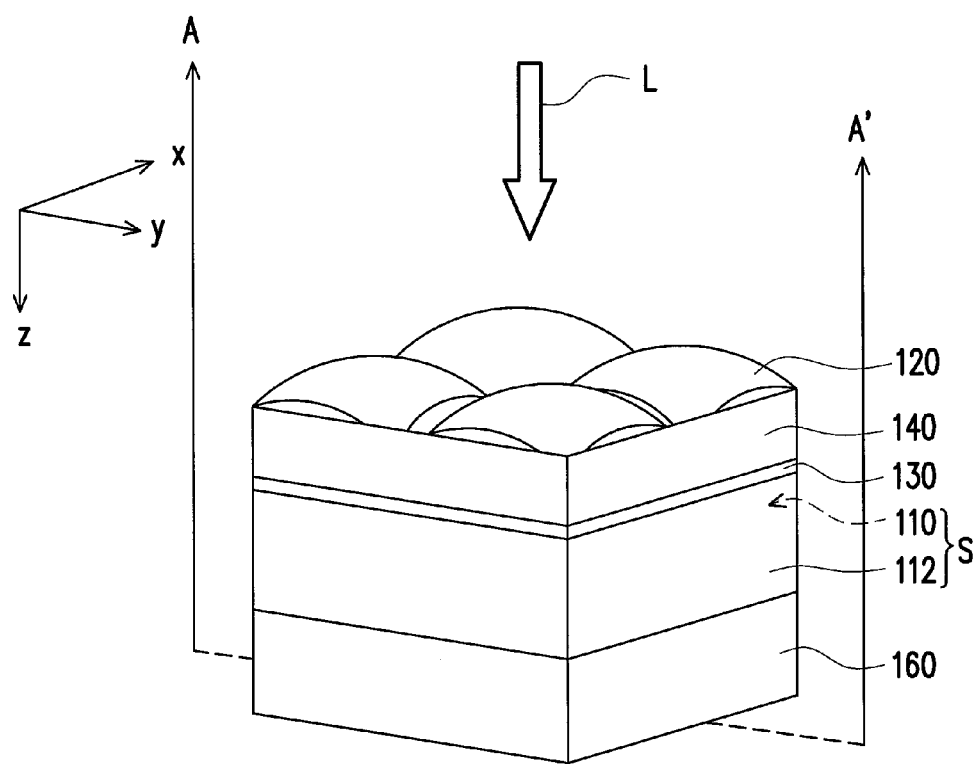
FIG. 1 is a three-dimensional schematic view of an image sensor according to an embodiment of the invention.
Figure 2:
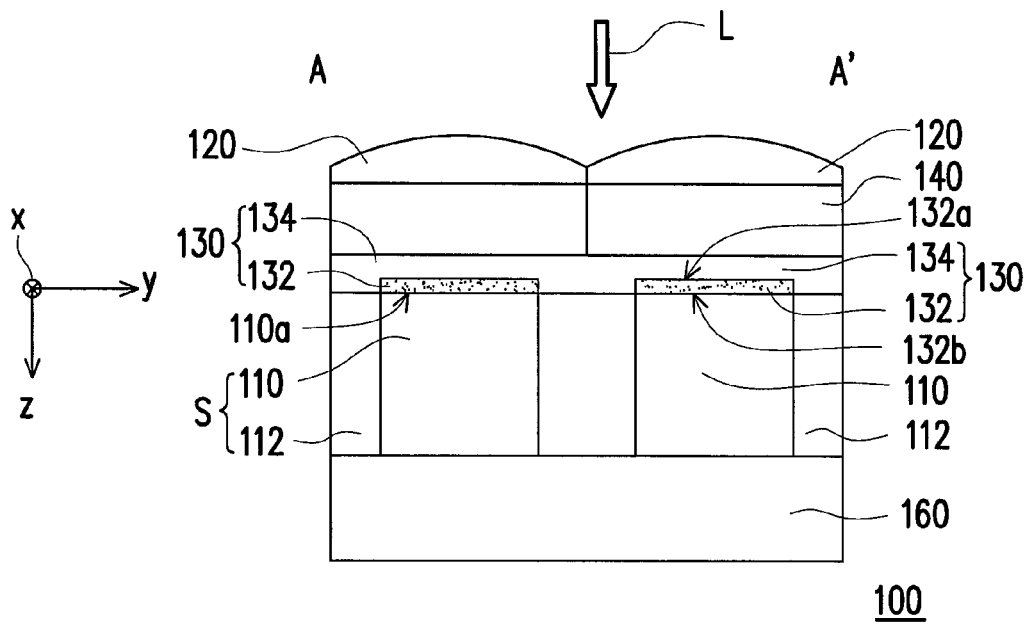
FIG. 2 is a schematic cross-sectional view illustrating the image sensor depicted in FIG. 1 along a section line A-A'.

FIG. 1 is a three-dimensional schematic view of an image sensor according to an embodiment of the invention. FIG. 2 is a schematic cross-sectional view illustrating the image sensor depicted in FIG. 1 along a section line A-A'. Referring to FIG. 1 and FIG. 2, an image sensor 100 includes a plurality of sensing pixels 110, a plurality of micro-lenses 120 disposed on the sensing pixels 110 and a plurality of first light distributing elements 130 disposed between the sensing pixels 110 and the micro-lenses 120. Each of the sensing pixels 110 is configured to convert a part of an incident light L into an electrical signal. The micro-lenses are configured to adjust the light path of the incident light L. In the present embodiment, the micro-lenses 120 may be a converging lens. The incident light L may be converged to the corresponding sensing pixel 110 through the micro-lenses 120, so as to improve the performance of the image sensor 100. However, the invention is not limited thereto. In other embodiments, the micro-lenses 120 may also be lenses in other forms, such as an aberration correction lens.

In the present embodiment, the micro-lenses 120 may be formed by utilizing the same lens film. But the invention is not limited thereto, the micro-lenses may also be formed by utilizing other appropriate methods. In addition, a number of the lens film having the micro-lenses is not limited to one layer, and manners of the micro-lenses and numbers of the lens film may both be decided according to actual requirements. In the present embodiment, the sensing pixels 110, the micro-lenses 120 and the first light distributing elements 130 are corresponding to each other. For instance, each of the sensing pixels 110 may be overlapped with one micro-lens 120 below and one first light distributing element 130. However, the invention is not limited thereto. In other embodiments, each of the sensing pixels 110 may also be overlapped with more than one first light distributing elements 130. Further, in the image sensor 100 of the present embodiment, a color filter layer 140 may be further disposed on the sensing pixels 110. However, the invention is not limited thereto. In other embodiments, the color filter layer 140 may be not disposed in the image sensor 100.

Figure 3:
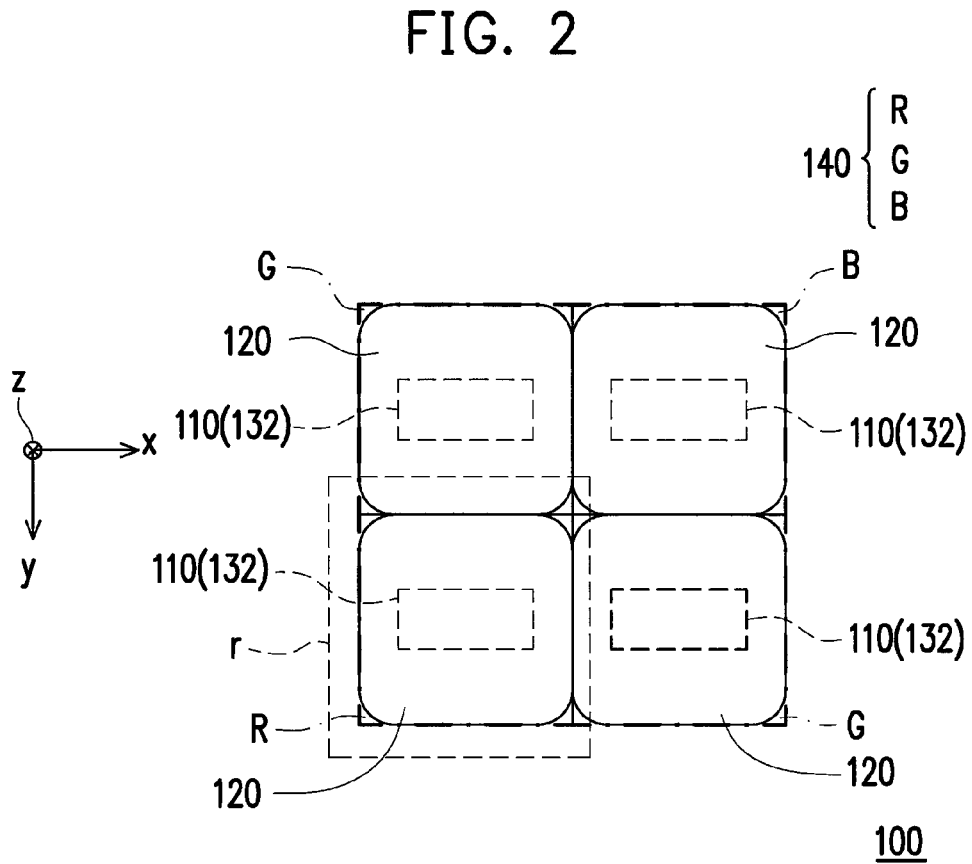
FIG. 3 is a top schematic view of the image sensor depicted in FIG. 2.
Figure 4:
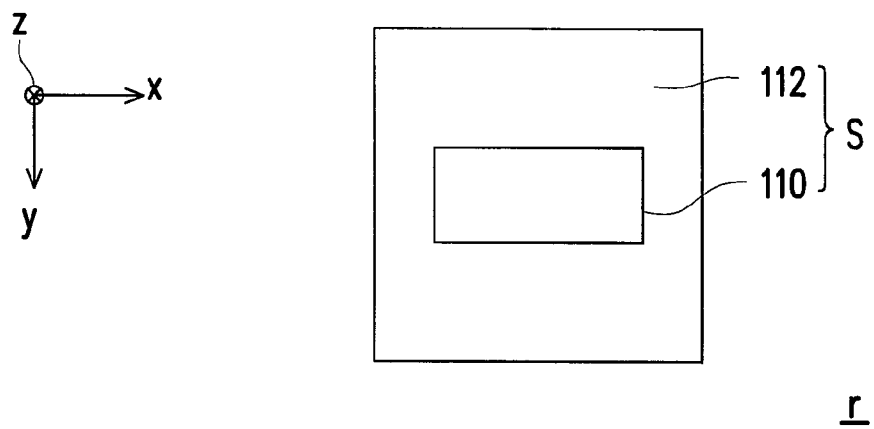
FIG. 4 shows a part of semiconductor substrate in a region r depicted in FIG. 3.

As shown in FIG. 2, the sensing pixels 110 of the present embodiment may be formed on a semiconductor substrate S. In other words, the sensing pixels 110 may be a semiconductor device such as a photo diode. FIG. 3 is a top schematic view of the image sensor depicted in FIG. 2. FIG. 4 shows a part of semiconductor substrate in a region r depicted in FIG. 3. Referring to FIG. 2, FIG. 3 and FIG. 4, besides the sensing pixels 110, the semiconductor substrate S of the present embodiment further includes a plurality of non active regions 112 located outside of the sensing pixels 110. Further, in the present embodiment, the color filter layer 140 includes a red filter pattern R, a green filter pattern G, and a blue filter pattern B. The red filter pattern R, the green filter pattern G, and the blue filter pattern B are respectively corresponding the sensing pixels 110 and corresponding the non active regions 112 which are overlapped said filter patterns.

As shown in FIG. 2, each of the first light distributing elements 130 includes a first refractive index pattern 132 and a second refractive index pattern 134 surrounding the first refractive index pattern 132. In the present embodiment, the first refractive index pattern 132 and at least a part of the second refractive index pattern 134 are substantially located on the same plane. The first refractive index patterns 132 of the first light distributing elements 130 may belong to the same film layer. The second refractive index patterns 134 of the first light distributing elements 130 may belong to another film layer. The film layer including the second refractive index patterns 134 may cover the film layer including the first refractive index patterns 132. In other words, each of the first refractive index patterns 132 has a first surface 132a facing the micro-lenses 120, and the second refractive index pattern 134 may cover the first surface 132a of each of the first refractive index patterns 132.

In the present embodiment, an anti-reflective structure (AR coating) may be composed of each of the first refractive index patterns 132 and a part of the second refractive index pattern 134 covered on the first surface 132a. The anti-reflective structure can increase the proportion of the incident light L entering the sensing pixels 100, so as to improve the performance of the image sensor 100. It should be noted that, the anti-reflective structure is not limited to be formed by the first refractive index pattern 132 and the second refractive index pattern 134 covered on the first surface 132a. In other embodiments, the anti-reflective structure may also be composed of each of the first refractive index patterns 132 and other film layers on the sensing pixels 110. Hereinafter, examples are described with reference to FIG. 5 and FIG. 6.

Figure 5:
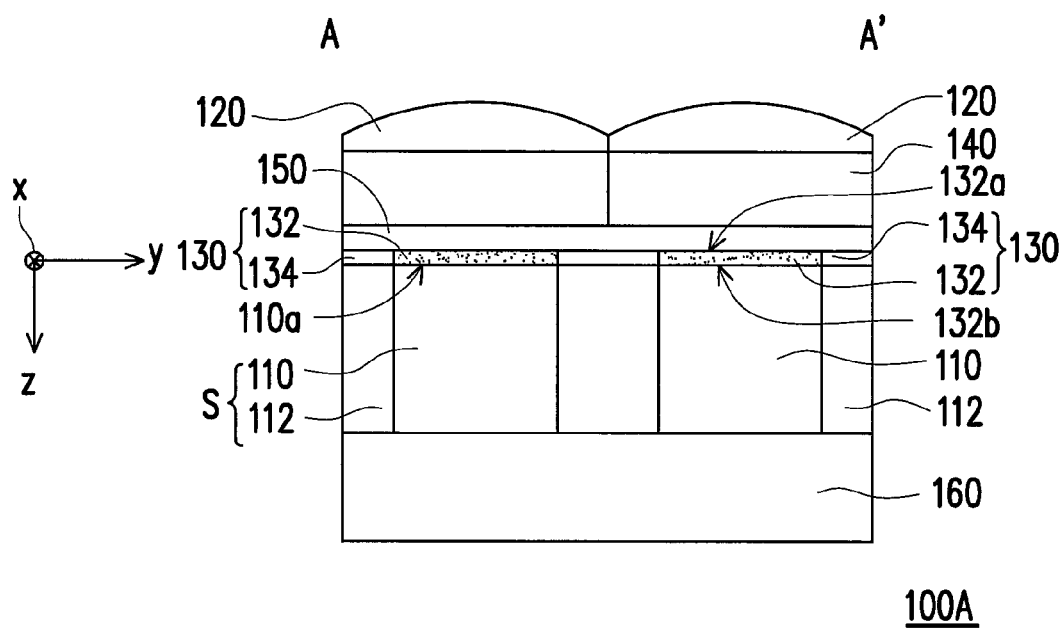
FIG. 5 is a schematic cross-sectional view of an image sensor according to another embodiment of the invention.

FIG. 5 is a schematic cross-sectional view of an image sensor according to another embodiment of the invention. An image sensor 100A depicted in FIG. 5 is similar to the image sensor 100 depicted in FIG. 2, thus identical elements are indicated by the same reference numbers. In the image sensor 100A, the second refractive index pattern 134 may not cover the first refractive index pattern 132. The second refractive index pattern 134 surrounding the first refractive index pattern 132 may be exposed to the first surface 132a of the refractive index pattern 132. The image sensor 100A further includes another film layer 150 other than the first refractive index pattern 132 and the second refractive index pattern 134. The anti-reflective structure may be composed of the first refractive index patterns 132 together with the film layer 150 stacked thereon. In the image sensor 100A, the film layer 150 may be located between the micro-lenses 120 and the first refractive index patterns 132. However, the invention is not limited thereto. In the other embodiments, the other film layer 150 may also be located between the first refractive index patterns 132 and the sensing pixels 110.

Figure 6:
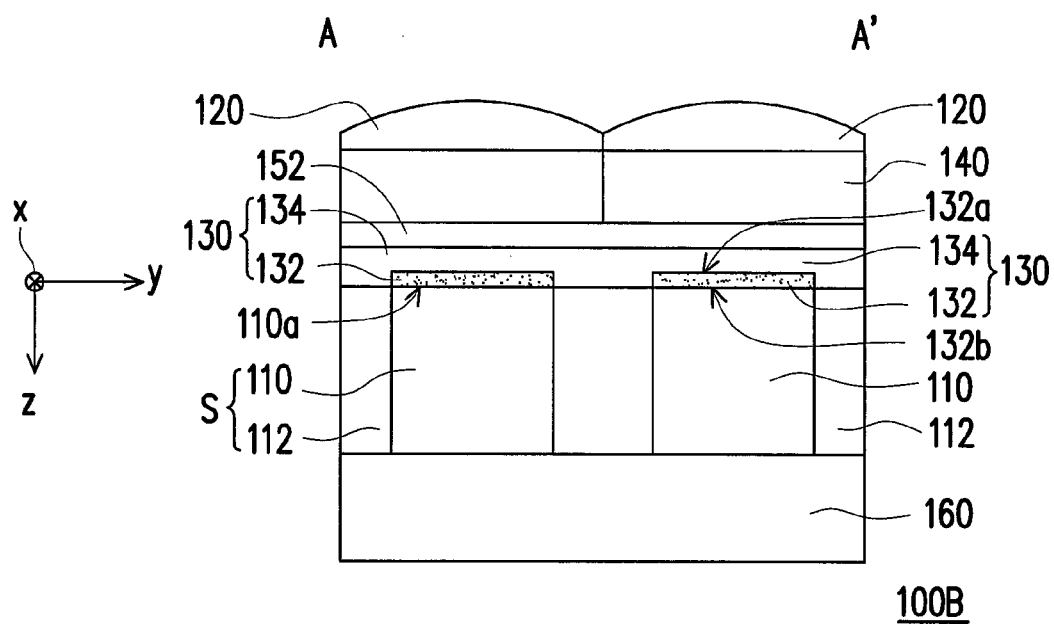
FIG. 6 is a schematic cross-sectional view of an image sensor according to yet another embodiment of the invention.

FIG. 6 is a schematic cross-sectional view of an image sensor according to yet another embodiment of the invention. An image sensor 100B depicted in FIG. 6 is similar to the image sensor 100 depicted in FIG. 2, thus identical elements are indicated by the same reference numbers. A difference between the image sensor 100 and the image sensor 100B is that, the image sensor 100B further includes another film layer 152. Another anti-reflective structure may be composed of the film layer 152 together with the first refractive index pattern 132 and the second refractive index patterns 134 covering the first refractive index patterns 132. In the image sensor 100B, the film layer 152 is located between the micro-lenses 120 and the second refractive index patterns 134. However, the invention is not limited thereto. In the other embodiments, the film layer 152 may also be located between the first refractive index patterns 132 and the sensing pixels 110.

Referring back to FIG. 2 and FIG. 3, from a top view, the first refractive index patterns 132 of the first light distributing elements 130 may be arranged in array and separated from each other. The second refractive index patterns 134 of the first light distributing elements 130 may contact with each other so as to form a pattern, and the pattern may fill the gaps between the first refractive index patterns 132. Further, in the present embodiment, each of the first refractive index patterns 132 and one corresponding sensing pixel 110 are substantially aligned in the direction z, which is perpendicular to the light receiving surface 110a of the sensing pixels 110.

In the present embodiment, the first refractive index pattern 132 and the second refractive index pattern 134 may both be transparent. In other words, the first light distributing elements 130 of the present embodiment do not block the incident light L. In the present embodiment, the first refractive index pattern 132 and the second refractive index pattern 134 may be a transparent material which is commonly used in a semiconductor process, such as silicon dioxide (SiO2), silicon nitride (SiNx), titanium dioxide (TiO2), silicon carbide (SiC) and etc. In other words, the first light distributing elements 130 may be manufactured together with the semiconductor substrate S having the sensing pixels 110 in the semiconductor process, so as to simplify the manufacturing process of the image sensor 100 of the present embodiment.

Figure 7:
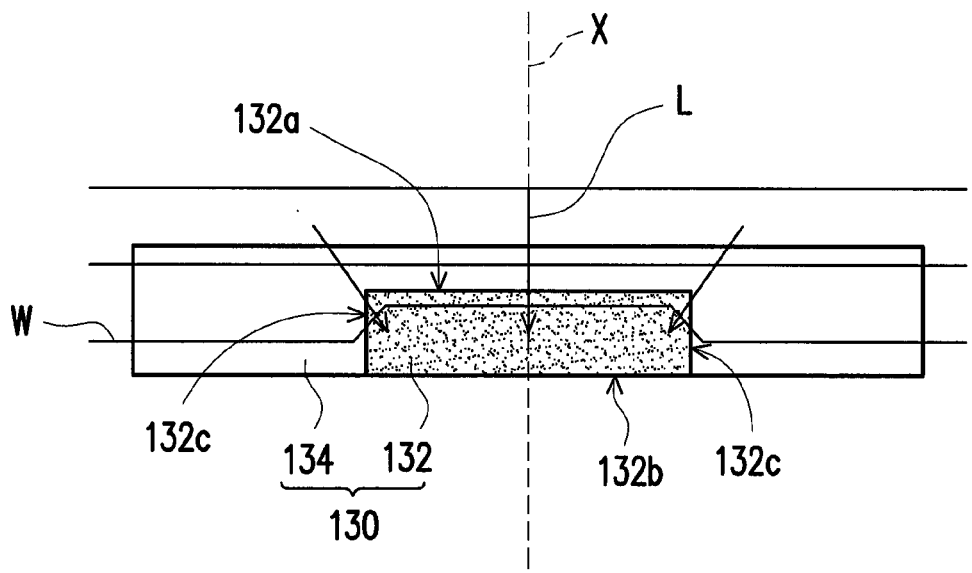
FIG. 7 shows a condition when an incident light is irradiated to the first light distributing element.
Figure 8A:
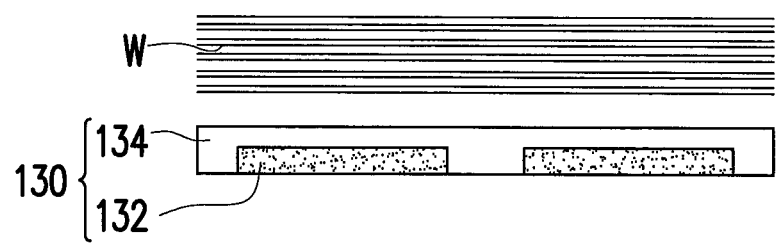
FIG. 8A to FIG. 8D simulate a process in which the incident light sequentially passes the first light distributing element.
Figure 8B:
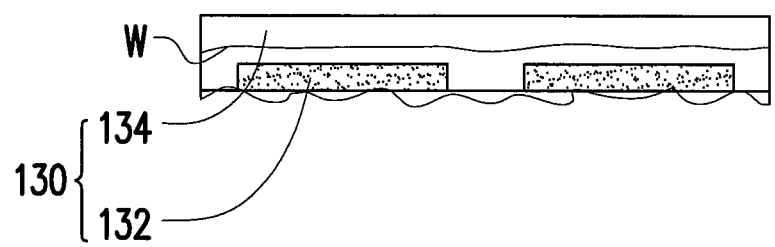
Figure 8C:
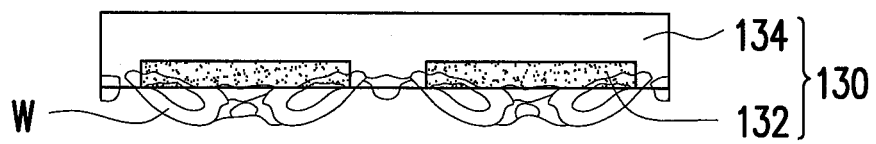
Figure 8D:
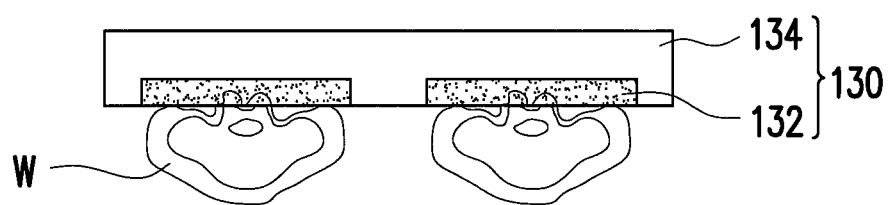

It should be noted that, in each of the first light distributing elements 130, the refractive index of the first refractive index pattern 132 is larger than the refractive index of the second refractive index pattern 134. With proper design of the refractive indexes and the relative positions between the first refractive index patterns 132 and the second refractive index patterns 134, the first light distributing element 130 can have a function of converging the incident light L. FIG. 7 shows a condition when an incident light is irradiated to the first light distributing element. As shown in FIG. 7, when the incident light L is transferred to the first light distributing element 130, a distortion may occur on an incident light wavefront w at an edge of the first refractive index pattern 132 (i.e., a boundary between the first refractive index pattern 132 and the second refractive index pattern 134), so as to converge the incident light L. More specifically, the first refractive index pattern 132 has the first surface 132a facing the micro-lenses 120, a second surface 132b facing the sensing pixels 110 and a sidewall 132c connecting the first surface 132a and the second surface 132b. A central axis X of the first refractive index pattern 132 penetrates the first surface 132a and the second surface 132b of the first refractive index pattern 132. When the incident light L from the micro-lens 120 is passing through the sidewall 132c of the first refractive index pattern 132, because there is a difference between refractive indexes of the first refractive index pattern 132 and the second refractive index pattern 134, the incident light L deflects towards the central axis X of the first refractive index pattern 132, and then converges after passing through the first light distributing element 130. In other word, the incident light L can be further focused to the sensing pixel 110 through the first light distributing element 130, so as to improve the performance of the image sensor 100.

In addition, it should be noted that, in the present disclosure, the focusing effect of the first light distributing element 130 is caused by the refractive index difference of the two materials. Therefore, in some embodiments, in order to achieve the condition that the refractive index of the first refractive index pattern 132 is larger than the refractive index of the second refractive index pattern 134, the difference between the refractive indexes of the two materials needs to be big enough for fully generating a focusing effect, even when neither shapes nor structures of the first refractive index pattern 132 and the second refractive index pattern 134 can provide the focusing effect (for instance, upper surfaces and lower surfaces of the two refractive index patterns are a plane or substantially a plane).

However, the invention is not limited thereto. In some embodiments, a final effect required may be accomplished by using the focusing effect caused by the difference between the refractive indexes together with a focusing effect caused by a shape or a structure of the first refractive index pattern 132. For instance, the shape or the structure of the first refractive index pattern 132 may be slightly curved, so as to facilitate in generating the focusing effect. Nevertheless, the focusing effect can still be generated mainly by the difference between the refractive indexes caused by the materials properties. In practical applications, any diffractive element/material capable of causing the difference between the refractive indexes may be adopted.

It should be noted that, the first refractive index pattern and the second refractive index pattern as mentioned herein may be implemented by using two different materials, respectively, but the invention is not limited thereto. For instance, the first refractive index pattern and the second refractive index pattern may also be implemented by using the same material but with a concentration of dopant therein being different, thereby causing the difference between the refractive indexes for generating the focusing effect. In addition, the first refractive index pattern and the second refractive index pattern may also be implemented by using two or more materials. It falls in the scope of the invention as long as the focusing effect can be eventually generated by "distribution of the refractive indexes" or "difference between the refractive indexes" of materials in which the difference is not limited to be occurred on a horizontal direction (i.e., it may also be occurred on a vertical direction or other directions) and said difference/distribution is not limited to be contiguous or non-contiguous.

FIG. 8A to FIG. 8D simulate a process in which the incident light sequentially passes the first light distributing element. In view of FIG. 8A to FIG. 8D, it can be proved that the first refractive index pattern 130 of the present embodiment can indeed converge the incident light L to the sensing pixel 110 by utilizing the difference between the refractive indexes of the first refractive index pattern 132 and the second refractive index pattern 134.

Figure 9A:
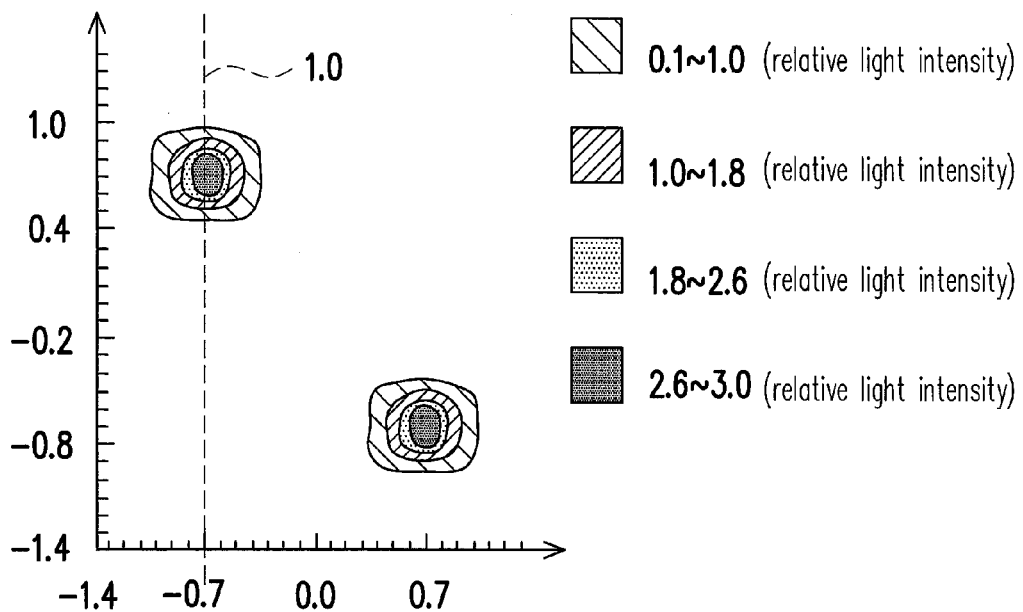
FIG. 9A simulates a light distribution of the sensing pixels of the image sensor in xy plane according to an embodiment of the invention.
Figure 9B:
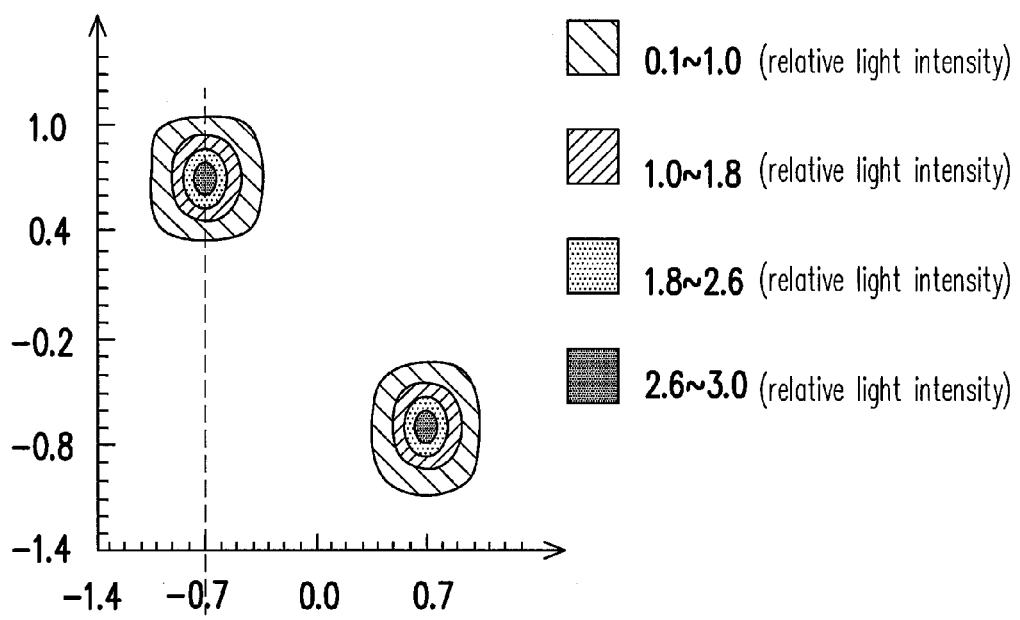
FIG. 9B simulates a light distribution of the sensing pixels of the image sensor in xy plane according to a comparison example.
Figure 10A:
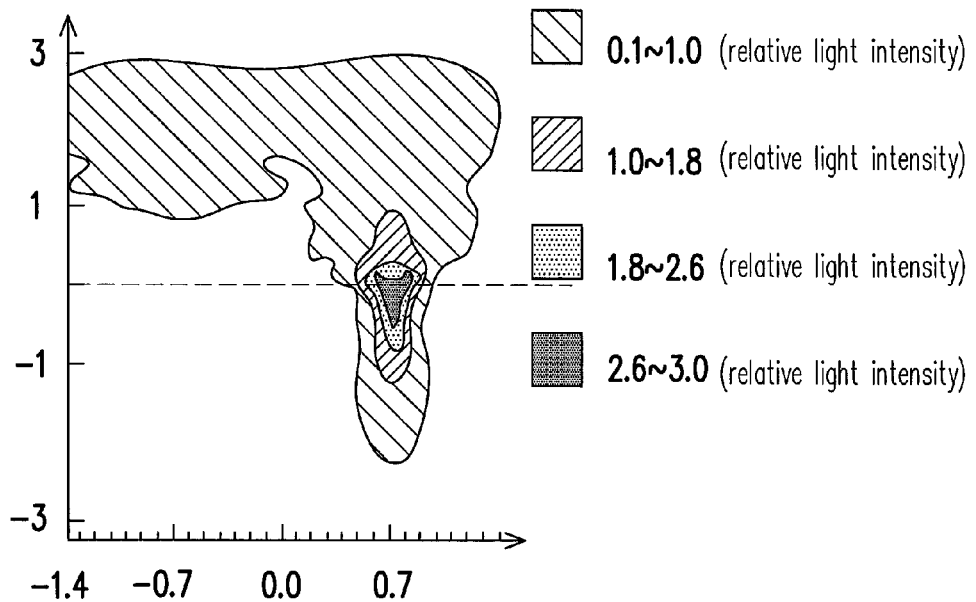
FIG. 10A simulates a light distribution of the sensing pixels of the image sensor in yz plane according to an embodiment of the invention.
Figure 10B:
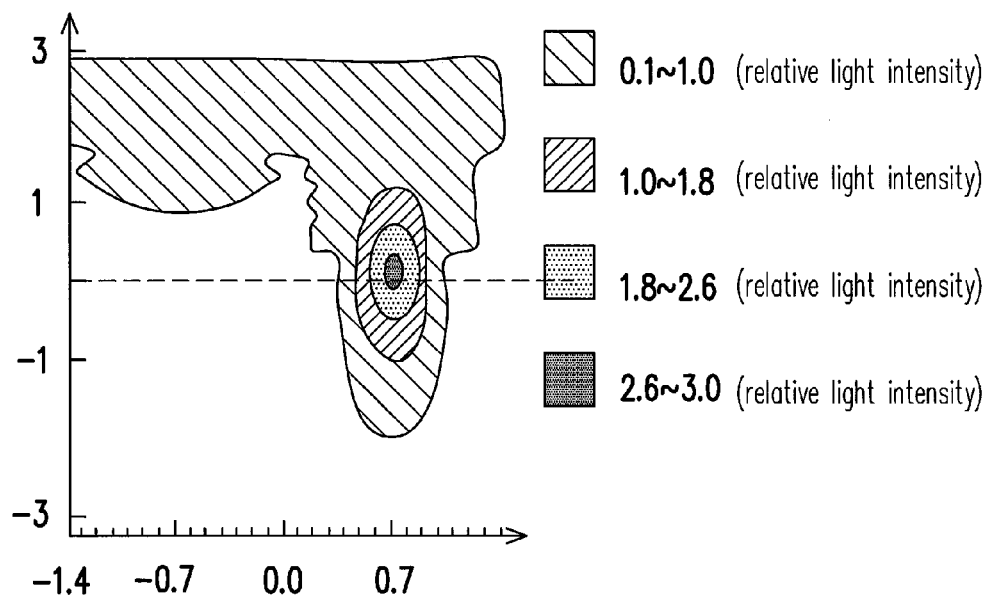
FIG. 10B simulates a light distribution of the sensing pixels of the image sensor in yz plane according to a comparison example.

FIG. 9A simulates a light distribution of the sensing pixels of the image sensor (with the structure as depicted in FIGS. 1 to 4) in xy plane (the surface of the sensing pixel that is close to the first light distributing element) according to an embodiment of the invention. FIG. 9B simulates a light distribution of the sensing pixels of the image sensor in xy plane according to a comparison example. FIG. 10A simulates a light distribution of the sensing pixels of the image sensor in yz plane according to an embodiment of the invention. FIG. 10B simulates a light distribution of the sensing pixels of the image sensor in yz plane according to a comparison example. The difference between the image sensor of the comparison example and the image sensor according to an embodiment of the invention is that, the image sensor of the comparison example does not include the first light distributing element. Comparing FIG. 9A with FIG. 9B and FIG. 10A with FIG. 10B, it can be proved that the incident light L is better focused with the addition of the first light distributing element 130 in the image sensor 100.

Figure 11A:
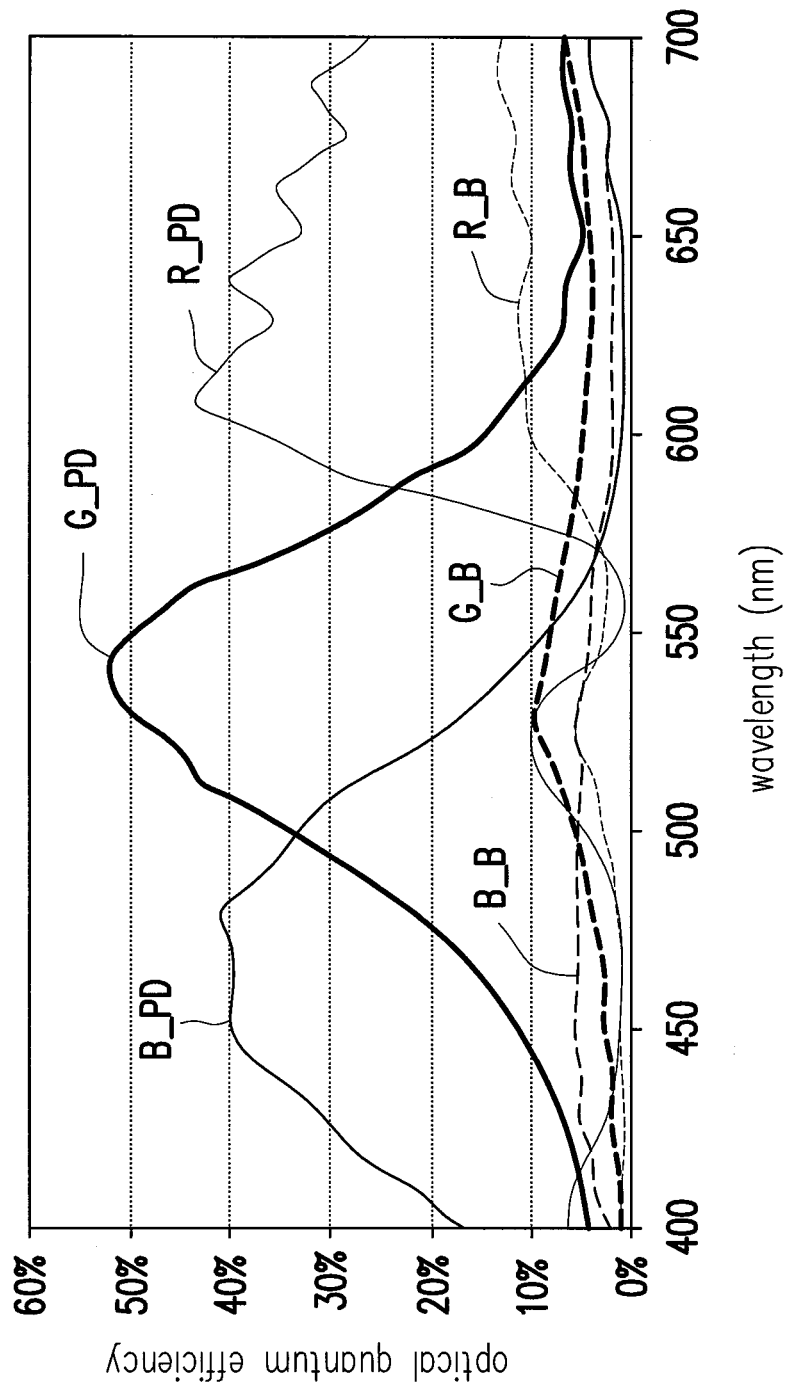
FIG. 11A simulates the optical quantum efficiency of the incident light on the sensing pixels of the image sensor according to an embodiment of the invention.
Figure 11B:
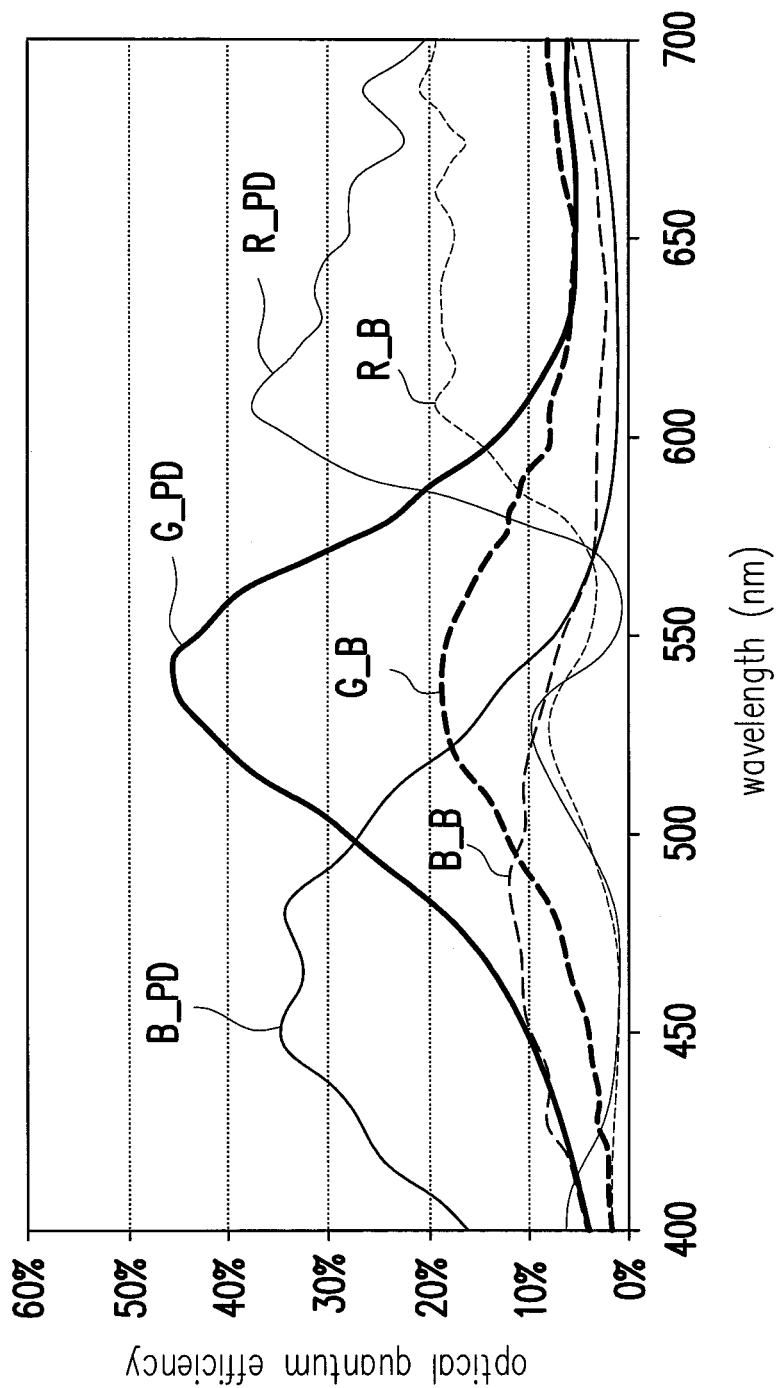
FIG. 11B simulates the optical quantum efficiency of the incident light on the sensing pixels of the image sensor according to a comparison example.

FIG. 11A simulates an optical quantum efficiency of the incident light on the sensing pixels of the image sensor (with the structure as depicted in FIGS. 1 to 4) according to an embodiment of the invention. FIG. 11B simulates an optical quantum efficiency of the incident light on the sensing pixels of the image sensor according to the comparison example. In FIGS. 11A and 11B, curves R_PD, G_PD and B_PD represent the optical quantum efficiencies of the incident light L on the sensing pixels 110 respectively corresponding to the red filter pattern R, the green filter pattern G, and the blue filter pattern B (as illustrated in FIG. 3), and curves R_B, G_B and B_B represent the optical quantum efficiencies of the incident light L on the non active regions 112 respectively corresponding to the red filter pattern R, the green filter pattern G, and the blue filter pattern B (as illustrated in FIG. 3). In comparing the curves R_PD, G_PD and B_PD in FIG. 11A with the same in FIG. 11B, it can be proved that the incident light L can be more effectively focused to the sensing pixel 110 with the addition of the first light distributing element 130 in the image sensor 100. That is, the image sensor 100 according to an embodiment of the invention has high pixel sensitivity. In comparing the curves R_B, G_B and B_B in FIG. 11A with the same in FIG. 11B, it can be proved that the amount of the incident light L transferred to the non active regions 112 can be reduced with the addition of the first light distributing element 130 in the image sensor 100. That is, the image sensor 100 according to an embodiment of the invention has lower crosstalk.

Figure 12A:
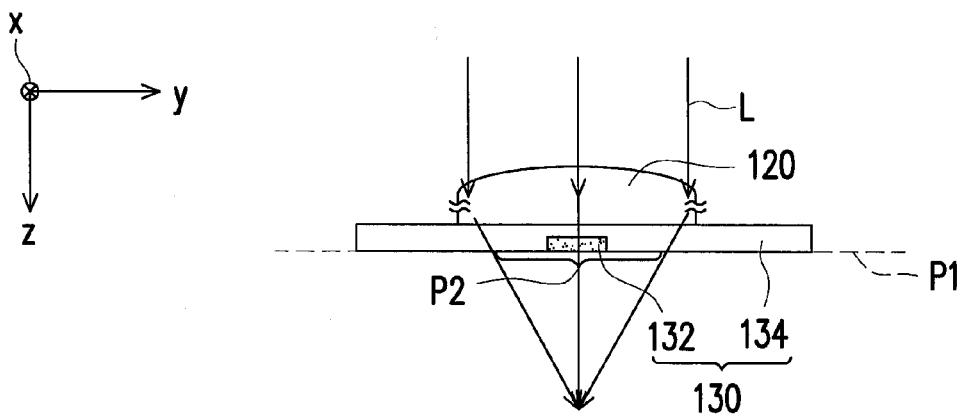
FIG. 12A to FIG. 12C show various sizes and disposing positions suitable for the first refractive index pattern.
Figure 12B:
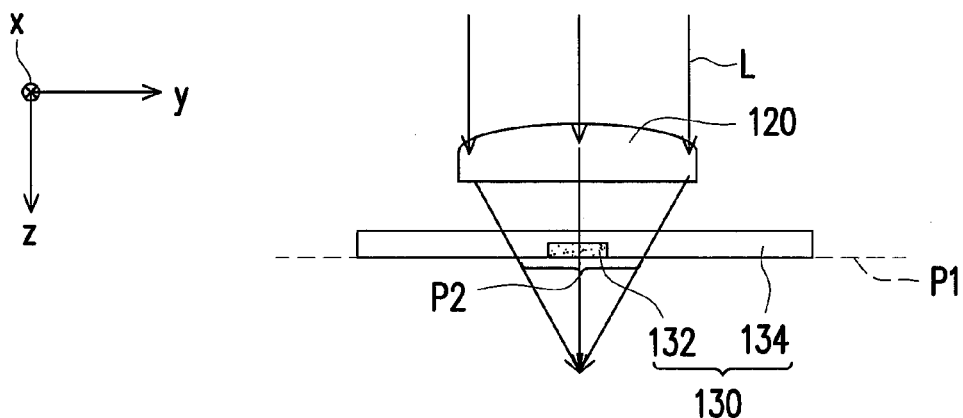
Figure 12C:
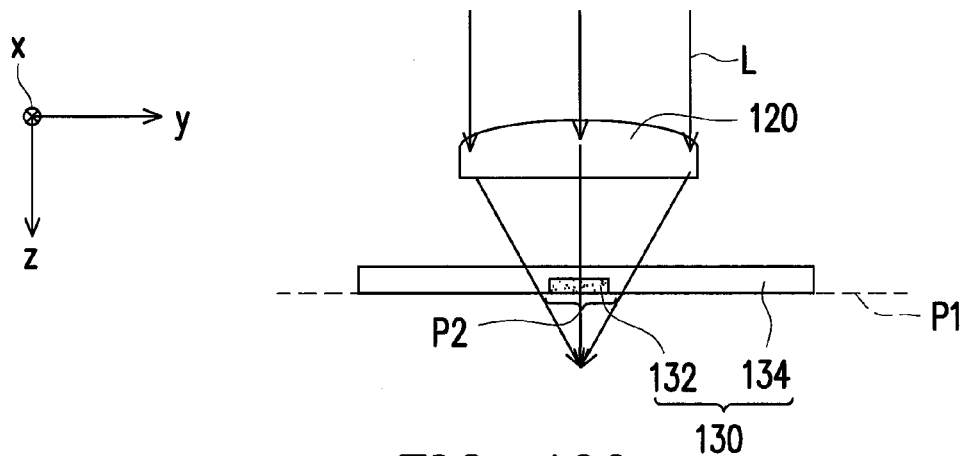

With appropriate design of the size and position of the first refractive index patterns 132, a more preferable effect for the first light distributing element 130 to converge the incident light L can be obtained. For instance, FIG. 12A to FIG. 12C show various sizes and disposing positions suitable for the first refractive index pattern. In FIG. 12A to FIG. 12C, each of the first refractive index patterns 132 is located on a reference plane P1, and a light spot P2 is formed on the reference plane P1 after the incident light L passes through the micro-lens 120 corresponding to the first refractive index pattern 132. The light spot P2 entirely covers the first refractive index pattern 132. In other words, under a principle that the light spot P2 entirely covers the first refractive index pattern 132, the desired position of the first light distributing elements 130 may be any position between the micro-lenses 120 and the sensing pixels 110, such as the three positions respectively shown in FIG. 12A to FIG. 12C.

On the other hand, a relative position between the first light distributing element 130 and the corresponding sensing pixel 110 can also be properly designed. More specifically, FIG. 13A to FIG. 13B respectively show a suitable relative position between the first light distributing element and the sensing pixels. Referring to FIG. 13A, the incident light L converges at a converging point C after passing through the sidewall 132c of the first refractive index pattern 132. The light receiving surface 110a of the sensing pixel 110 corresponding to the first refractive index pattern 132 may be located between the first refractive index pattern 132 and the converging point C. Or, as shown in FIG. 13B, the light receiving surface 110a of the sensing pixel 110 corresponding to the first refractive index pattern 132 may be located on the converging point C.

In comparison with a light guide of conventional art, the first light distributing element 130 of the present embodiment not only has the function of converging the incident light L to sensing pixel 110, but also has an advantage in manufacturing with ease and low manufacturing costs. More specifically, as shown in FIG. 2, the first surface 132a of the first refractive index pattern 132 is a surface closest to the micro-lenses 120 in the first refractive index pattern 132, and the first surface 132a may be a smooth surface. The sidewall 132c of the first refractive index pattern 132 contacts with the first surface 132a and the second surface 132b. The sidewall 132c of the first refractive index pattern 132 may also be a smooth surface. In other words, the first refractive index pattern 132 of the first light distributing element 130 according to the present embodiment may be completed in one single process. As to light guide, since its purpose is to guide incident light through multiple layers, its structure must also penetrate the multiple layers. Thus the structure is hard to be combined with AR coating, and it depth also makes its process more difficult than the process of the first light distributing element 130.

In the present embodiment, the first surface 132a of the first refractive index pattern 132 may be a plane that is substantially parallel to the light receiving surface 110a of the sensing pixel 110, and the sidewall 132c of the first refractive index pattern 132 may be a plane that is substantially perpendicular to the light receiving surface 110a of the sensing pixel 110. From another perspective, a cross section is cut by cutting the first refractive index pattern 132 with a reference plane (e.g., a paper surface of FIG. 2) perpendicular to the light receiving surface 110a of the sensing pixels 110. The cross section is approximately a rectangular shape. However, the invention is not limited thereto. In other embodiments, the first refractive index pattern 132 may also be other shapes. Hereinafter, examples are described with reference to FIG. 14, FIG. 15 and FIG. 16.

Figure 14:
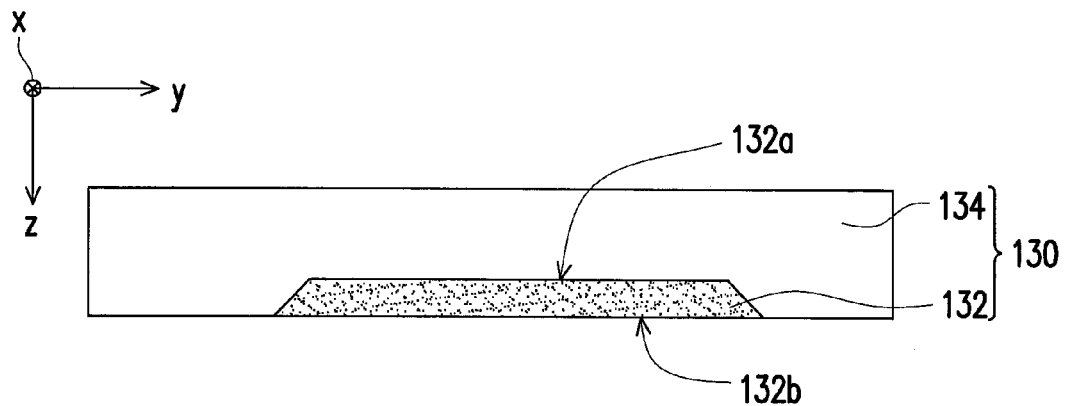
FIG. 14, FIG. 15 and FIG. 16 are schematic cross-sectional views of the first light distributing elements according to other embodiments of the invention.
Figure 15:
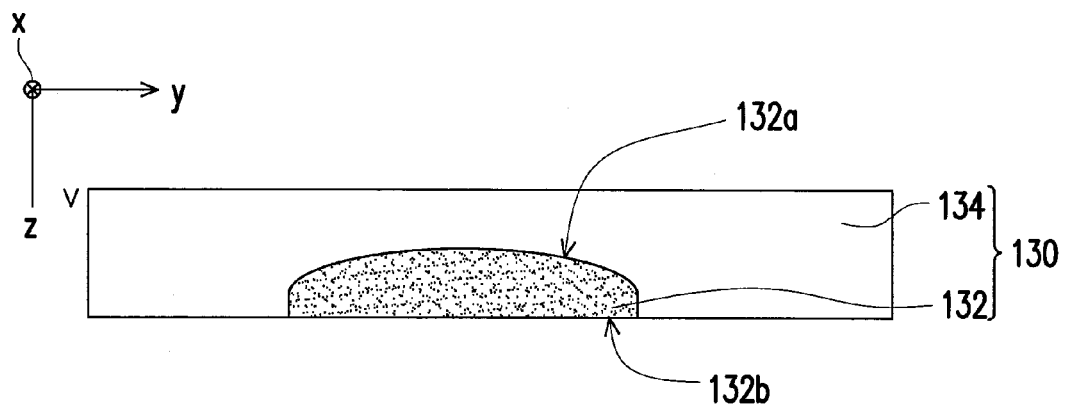
Figure 16:
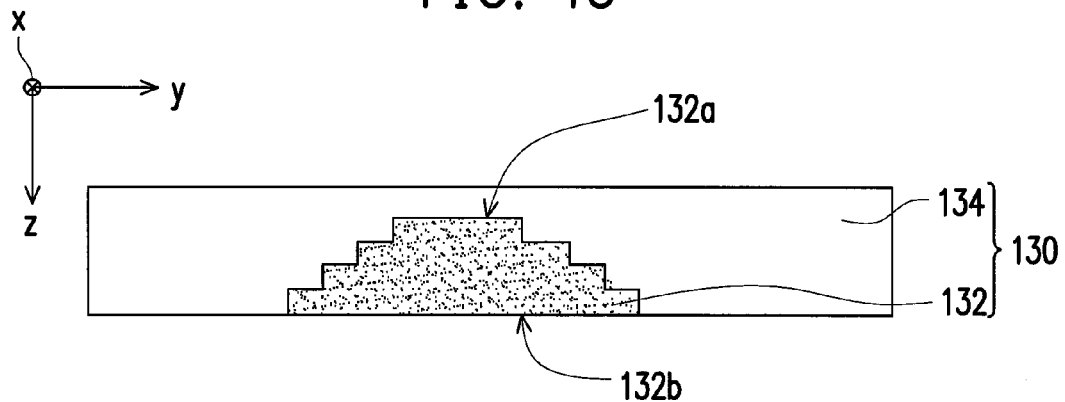

FIG. 14, FIG. 15 and FIG. 16 are schematic cross-sectional views of the first light distributing elements according to other embodiments of the invention. Referring to FIG. 14 and FIG. 15, the cross section cut by cutting the first refractive index pattern 132 with the reference plane (e.g., paper surfaces of FIG. 14 and FIG. 15) perpendicular to the light receiving surface 110a of the sensing pixels 110 may also be approximately a trapezoid shape or an arciform shape. The first refractive index patterns 132 depicted in FIG. 14 and FIG. 15 have the advantage in manufacturing with ease as similar to the first refractive index pattern 132 of FIG. 2. However, the invention is not limited thereto. Referring to FIG. 16, in other embodiments, the cross section cut by cutting the first refractive index pattern 132 with a reference plane (e.g., a paper surface of FIG. 16) perpendicular to a light receiving surface 110a of the sensing pixels 110 may be approximately a ladder shape or other appropriate shapes.

Referring back to FIG. 1 and FIG. 2, the sensing pixel 100 of the present embodiment further includes a circuit layer 160 electrically connected to the sensing pixels 110. In the present embodiment, the sensing pixels 110 are disposed between the micro-lenses 120 and the circuit layer 160. Furthermore, the sensing pixels 110 are disposed between the first light distributing elements 130 and the circuit layer 160. In other words, the light distributing element 130 of the present embodiment is disposed in a backside illuminated image sensor. However, the invention is not limited thereto. The light distributing element 130 may also be disposed in a front side illuminated image sensor. Details thereof are specifically described with reference to FIG. 17.

Figure 17:
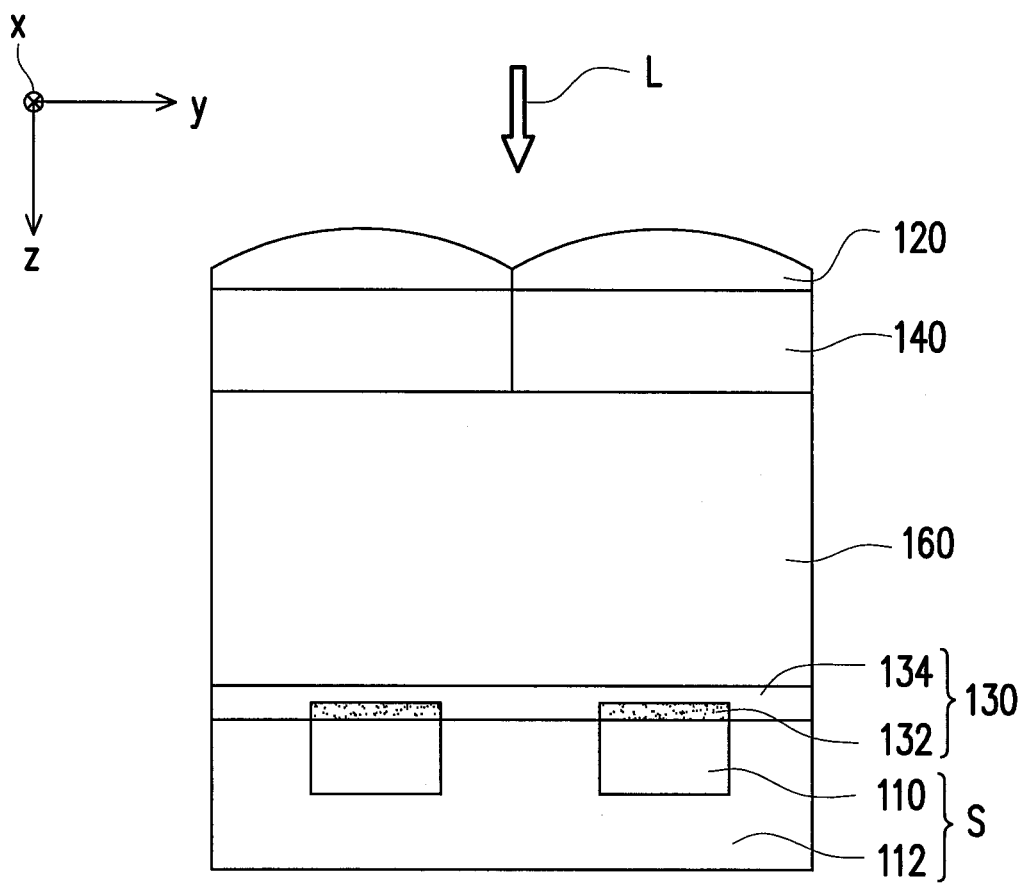
FIG. 17 is a schematic cross-sectional view of an image sensor according to another embodiment of the invention.

FIG. 17 is a schematic cross-sectional view of an image sensor according to another embodiment of the invention. Referring to FIG. 17, an image sensor 100C depicted in FIG. 17 is similar to the image sensor 100 depicted in FIG. 2, thus identical elements are indicated by the same reference numbers. The image sensor 100C of FIG. 17 is a front side illuminated image sensor. In other words, in FIG. 17, the circuit layer 160 is disposed between the micro-lenses 120 and the sensing pixels 110, and the first light distributing elements 130 may be disposed between the circuit layer 160 and the sensing pixels 110. It should be noted that, although the first refractive index pattern 132 is illustrated as to be located below the circuit layer 160 (which includes metal wires) in FIG. 17, but the invention is not limited thereto. The first refractive index pattern 132 may be, for example, disposed above the circuit layer 160, or disposed in a center or a lateral side of the circuit layer 160. In addition, a more preferable position is usually a place closest to the sensing pixel 110.

As shown in FIG. 2, in the present embodiment, one sensing pixel 110 corresponds to one first light distributing element 130. However, the invention is not limited thereto. In other embodiments, one sensing pixel 110 may correspond to a plurality of light distributing elements which are identical to the first light distributing elements 130. In other word, the image sensor 100 can converge the incident light L successively to the sensing pixel 110 through the plurality of light distributing elements, so as to improve the performance of the image sensor 100. Hereinafter, examples are described with reference to FIG. 18 and FIG. 19.

Figure 18:
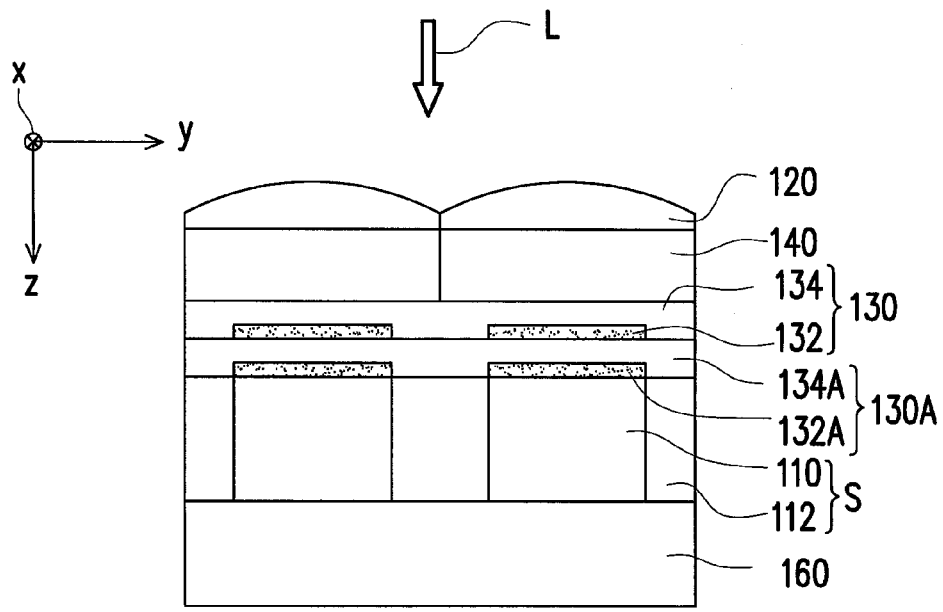
FIG. 18 is a schematic cross-sectional view of an image sensor according to yet another embodiment of the invention.

FIG. 18 is a schematic cross-sectional view of an image sensor according to yet another embodiment of the invention. Referring to FIG. 18, an image sensor 100D depicted in FIG. 18 is similar to the image sensor 100 depicted in FIG. 2, thus identical elements are indicated by the same reference numbers. A difference between the image sensor 100D depicted in FIG. 18 and the image sensor 100 depicted in FIG. 2 is that, the image sensor 100D depicted in FIG. 18 further includes a plurality of second light distributing elements 130A. The second light distributing elements 130A are disposed between the micro-lenses 120 and the first light distributing elements 130. Each of the second light distributing elements 130A includes a third refractive index pattern 132A and a fourth refractive index pattern 134A surrounding the third refractive index pattern 132A, wherein a refractive index of the third refractive index pattern 132A is larger than a refractive index of the fourth refractive index pattern 134A. In summary, a structure of the second light distributing elements 130A may be identical to that of the first light distributing element 130. In the embodiment of FIG. 18, the first light distributing element 130 may contact with the second light distributing element 130A.

Figure 19:
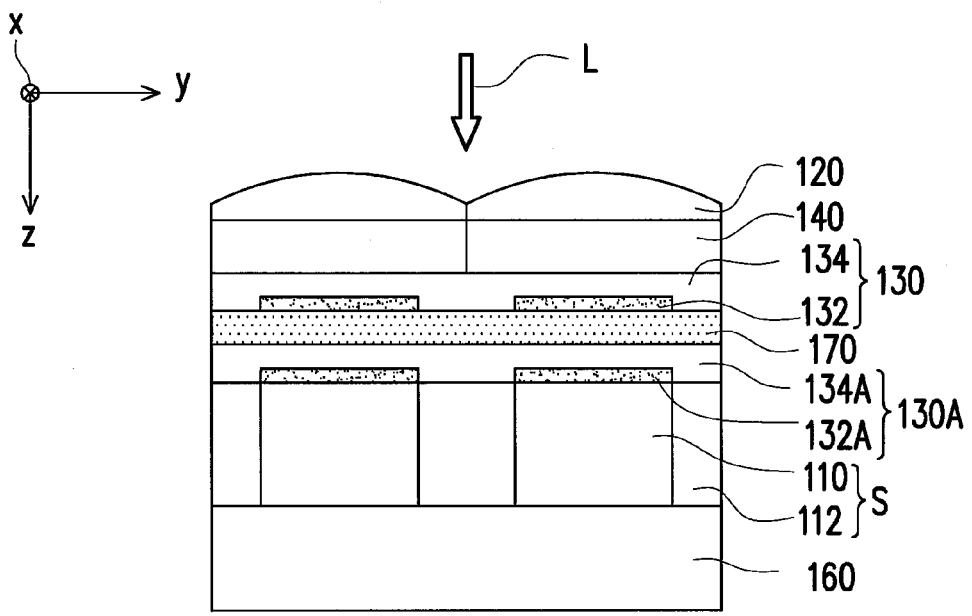
FIG. 19 is a schematic cross-sectional view of an image sensor according to still another embodiment of the invention.

FIG. 19 is a schematic cross-sectional view of an image sensor according to still another embodiment of the invention. Referring to FIG. 19, an image sensor 100E depicted in FIG. 19 is similar to the image sensor 100D depicted in FIG. 18, thus identical elements are indicated by the same reference numbers. A difference between the image sensor 100E depicted in FIG. 19 and the image sensor 100D depicted in FIG. 18 is that, the first light distributing element 130 may not contact with the second light distributing element 130A. More specifically, the image sensor 100E of FIG. 19 further includes a spacer 170 located between the first light distributing element 130 and the second light distributing element 130A. The spacer 170 allows the first light distributing element 130 to maintain a proper distance from the second light distributing element 130A. A material of the spacer 170 includes a transparent material, for example.

In summary, the image sensor according to an embodiment of the invention can converge the incident light effectively to the sensing pixel through the light distributing elements, so as to improve the performance of the image sensor. Further, since the structure of the refractive index pattern in the light distributing elements is simple, the light distributing elements can be completed by using a simple process. Therefore, in comparison with the light guide in conventional art, the image sensor according to an embodiment of the invention is provided with high performance as well as advantages in manufacturing with ease and low costs.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An image sensor, comprising:
a plurality of sensing pixels;
a plurality of micro-lenses disposed on the sensing pixels; and
a plurality of first light distributing elements disposed between the sensing pixels and the micro-lenses, and each of the first light distributing elements including:
a first refractive index pattern; and
a second refractive index pattern surrounding the first refractive index pattern, and a refractive index of the first refractive index pattern being larger than a refractive index of the second refractive index pattern, wherein the first refractive index pattern has a first surface facing one of the micro-lenses, the second refractive index pattern covers the first surface of the first refractive index pattern, the micro-lens corresponding to the first light distributing element has an optic axis, and a straight line direction extending from one of the sensing pixels towards the micro-lens is parallel with the optic axis, wherein the first refractive index pattern, the second refractive index pattern and the micro-lens are sequentially arranged along the straight line direction.

2. The image sensor of claim 1, wherein the first refractive index pattern and at least a part of the second refractive index pattern are located on the same plane.

3. The image sensor of claim 1, wherein an anti-reflective structure is composed of each of the first refractive index patterns and other film layers on the sensing pixels.

4. The image sensor of claim 3, wherein the other film layer is the second refractive index pattern.

5. The image sensor of claim 1, wherein the first refractive index pattern and the second refractive index pattern of each of the first light distributing elements are transparent.

6. The image sensor of claim 1, wherein each of the first refractive index patterns is located on a reference plane, and an incident light passing through the micro-lens corresponding to the first refractive index pattern forms a light spot on the reference plan, and the light spot entirely covers the first refractive index pattern.

7. The image sensor of claim 1, wherein the first refractive index pattern has a first surface facing the micro-lenses, a second surface facing the sensing pixels and a sidewall connecting the first surface and the second surface; and when an incident light from each of the micro-lenses is passing through the sidewall of the first refractive index pattern, the incident light deflects towards a central axis of the first refractive index pattern, and the central axis of the first refractive index pattern penetrates the first surface and the second surface of the first refractive index pattern.

8. The image sensor of claim 7, wherein the incident light converges at a converging point after passing through the sidewall of the first refractive index pattern, and a light receiving surface of the sensing pixel corresponding to the first refractive index pattern is located between the first refractive index pattern and the converging point, or located on the converging point.

9. The image sensor of claim 7, wherein the first surface of the first refractive index pattern is a smooth surface closest to the micro-lenses in the first refractive index pattern, and the sidewall of the first refractive index pattern is a smooth surface contacting with the first surface and the second surface.

10. The image sensor of claim 7, wherein a cross section is cut by cutting the first refractive index pattern with a reference plane perpendicular to a light receiving surface of the sensing pixels, and the cross section is a rectangular shape, a trapezoid shape or an arciform shape.

11. The image sensor of claim 7, wherein the first surface of the first refractive index pattern is a plane parallel to a light receiving surface of the sensing pixels, and the sidewall of the first refractive index pattern is a plane perpendicular to the light receiving surface of the sensing pixels.

12. The image sensor of claim 1, further comprising a plurality of second light distributing elements disposed between the micro-lenses and the first light distributing elements, and each of the second light distributing elements including a third refractive index pattern and a fourth refractive index pattern surrounding the third refractive index pattern, wherein a refractive index of the third refractive index pattern is larger than a refractive index of the fourth refractive index pattern.

13. The image sensor of claim 12, wherein the first light distributing elements contact with the second light distributing elements.

14. The image sensor of claim 12, further comprising a spacer located between the first light distributing elements and the second light distributing elements.

15. The image sensor of claim 1, further comprising a circuit layer electrically connected to the sensing pixels, and the sensing pixels being disposed between the first light distributing elements and the circuit layer.

16. The image sensor of claim 1, further comprising a circuit layer electrically connected to the sensing pixels, and the first light distributing elements being disposed between the circuit layer and the sensing pixels.

17. The image sensor of claim 1, wherein each of the first refractive index patterns and the corresponding sensing pixel are aligned in a direction perpendicular to a light receiving surface of the sensing pixels.

18. The image sensor of claim 1, wherein the first refractive index patterns of the first light distributing elements are arranged in array and separated from each other, and the second refractive index patterns of the first light distributing elements contact with each other so as to form a pattern that fills gaps between the first refractive index patterns.

19. The image sensor of claim 1, wherein the first refractive index patterns of the first light distributing elements belong to the same layer, and the second refractive index patterns of the first light distributing elements belong to the same film layer.

* * * * *